US008536925B2

(12) United States Patent
Bhattacharya et al.

(10) Patent No.: US 8,536,925 B2
(45) Date of Patent: Sep. 17, 2013

(54) VOLTAGE LEVEL TRANSLATOR CIRCUIT (75) Inventors: Dipankar Bhattacharya, Macungie, PA (US); Makeshwar Kothandaraman, Whitehall, PA (US); John C. Kriz, Palmerton, PA (US); Bernard L. Morris, Emmaus, PA (US); Jeffrey J. Nagy, Allentown, PA (US); Peter J. Nicholas, Philadelphia, PA (US)

(73) Assignee: Agere Systems LLC, Allentown, PA (US)

( * ) Notice: Subject to any disclaimer, the term of this patent is extended or adjusted under 35 U.S.C. 154(b) by 189 days.

(21) Appl. No.: 12/598,352

(22) PCT Filed: Dec. 29, 2008

(86) PCT No.: PCT/US2008/088441

§ 371 (c)(1),
(2), (4) Date: Oct. 30, 2009

(87) PCT Pub. No.: WO2010/077233

PCT Pub. Date: Jul. 8, 2010

(65) Prior Publication Data

US 2011/0187431 A1 Aug. 4, 2011

(51) Int. Cl.
H03L 5/00 (2006.01)
(52) U.S. Cl.
USPC .......................... 327/333; 327/112
(58) Field of Classification Search
USPC ............... 327/108, 112, 333; 326/68, 80–83, 326/26, 27; 365/189.11
See application file for complete search history.

(56) References Cited

U.S. PATENT DOCUMENTS

| 5,406,141 | A | * | 4/1995 | Yero et al. ........................ 326/68 |
| 5,969,542 | A | | 10/1999 | Maley et al. |
| 6,801,064 | B1 | * | 10/2004 | Hunt et al. ..................... 327/333 |
| 7,215,146 | B2 | * | 5/2007 | Khan .............................. 326/83 |
| 7,348,800 | B2 | | 3/2008 | Koto et al. |
| 2006/0091907 | A1 | | 5/2006 | Khan |
| 2007/0085566 | A1 | | 4/2007 | Koto et al. |

FOREIGN PATENT DOCUMENTS

| DE | 102005024955 | 12/2006 |
| EP | 0578526 | 1/1994 |
| JP | H09177734 A | 6/1994 |
| JP | H09116416 A | 5/1997 |
| JP | 2007116344 A | 5/2007 |
| WO | PCT/US2008/088441 | 1/2009 |

* cited by examiner

*Primary Examiner* — Long Nguyen
(74) *Attorney, Agent, or Firm* — Ryan, Mason & Lewis, LLP (57) ABSTRACT A voltage translator circuit (320) includes an input stage (322) adapted for receiving an input signal referenced to a first voltage supply (VDD core), a latch (326) adapted for connection to a second voltage supply (VDD33) and operative to at least temporarily store a logic state of the input signal, and a voltage clamp (324) coupled between the input stage (322) and the latch (326). The voltage clamp (322) is operative to set a maximum voltage across the latch (326) to a first prescribed level and to set a maximum voltage across the input stage to a second prescribed level. The voltage translator circuit (320) generates a first output signal (I1) at a junction between the latch (326) and the voltage clamp (324). The voltage translator circuit generates a second output signal (I5) at a junction between the voltage clamp (324) and the input stage (322).

20 Claims, 8 Drawing Sheets

VOLTAGE LEVEL TRANSLATOR CIRCUIT

FIELD OF THE INVENTION

The present invention relates generally to electrical and electronic circuitry, and more particularly relates to voltage level translation circuits.

BACKGROUND OF THE INVENTION

A field-effect-transistor (FET) comprises a gate oxide, which is an insulating layer between a gate and a channel region of the transistor. When used in digital logic applications, FETs are often fabricated with what is referred to as a core gate oxide, which, in recent integrated circuit (IC) fabrication technologies, is typically a very thin gate oxide, such as, for example, about 2 nanometers (nm) or less. Core or thin gate oxide transistors are typically capable of supporting, without damage, only relatively low voltages (e.g., core level voltages), for example, about 1.2 volts (V) or less. A transistor comprising a core gate oxide is often referred to as a core transistor and supports core voltage levels.

In certain applications, including, for example, some input/output (I/O) buffer and analog applications, transistors capable of supporting, without damage, higher voltages (e.g., I/O level voltages), for example, about 1.98, 3.63 or 5.5 volts, are required. A transistor capable of supporting these relatively higher I/O level voltages is typically fabricated having what is typically referred to as a thick gate oxide which, in recent technologies, may include devices having gate oxide thicknesses of, for example, about 2.3 nm or greater. A transistor comprising a thick gate oxide is often referred to as a thick oxide transistor and supports higher I/O voltage levels. Many IC fabrication processes provide both core transistors and thick oxide transistors.

In certain applications, such as, for example, in a hot carrier injection (HCI) application, in order to somewhat increase the voltage that a transistor device can withstand without experiencing long-term damage, a channel length of the device can be increased. However, this can significantly increase the area required by a circuit employing such transistors, which is undesirable. It is also known to use a triple gate oxide process in IC fabrication for providing transistors having even thicker gate oxides, and therefore supporting higher voltage levels without sustaining damage. Such transistors may be used in high-voltage applications, including, for example, electro-static discharge (ESD) protection. However, in standard IC fabrication processes, such as, for example, 40-nm technology, one is restricted to using only a single thick oxide transistor type, primarily because adding an extra thick gate oxide to the process inherently lowers the yield of the fabricated devices and adds unnecessary cost and complexity. Additionally, as gate oxide increases, gate capacitance increases accordingly, thereby degrading high-frequency performance of the device. This forces a circuit designer to make a decision as to which of the available thick gate oxides will be used in a system-on-a-chip (SoC) design.

SUMMARY OF THE INVENTION

Embodiments of the present invention provide techniques which enable the use of transistors having a thinner gate oxide thickness in applications which require driving voltage levels higher than otherwise supported by the fabrication process. In this manner, transistors having enhanced high-frequency performance can be utilized to drive higher voltage levels without sustaining damage to the transistor. In order to accomplish this, the present invention, in illustrative embodiments thereof, provides a voltage level translator circuit and I/O buffer, employing only core transistors and thick oxide transistors of a single type, that provide translated voltage levels above input voltage levels and above a maximum voltage level otherwise supported by the IC fabrication process.

In accordance with one aspect of the invention, a voltage translator circuit includes an input stage adapted for receiving an input signal referenced to a first voltage supply, a latch adapted for connection to a second voltage supply and operative to at least temporarily store a logic state of the input signal, and a voltage clamp coupled between the input stage and the latch. The voltage clamp is operative to set a maximum voltage across the latch to a first prescribed level and to set a maximum voltage across the input stage to a second prescribed level. The voltage translator circuit generates a first output signal at a junction between the latch and the voltage clamp. The voltage translator circuit generates a second output signal at a junction between the voltage clamp and the input stage.

In accordance with another embodiment of the invention, a buffer circuit includes at least one voltage translator circuit. The voltage level translator includes an input stage adapted for receiving an input signal referenced to a first voltage supply, a latch adapted for connection to a second voltage supply and operative to at least temporarily store a logic state of the input signal, and a voltage clamp coupled between the input stage and the latch. The voltage clamp is operative to set a maximum voltage across the latch to a first prescribed level and to set a maximum voltage across the input stage to a second prescribed level. The voltage translator circuit generates a first output signal at a junction between the latch and the voltage clamp. The voltage translator circuit generates a second output signal at a junction between the voltage clamp and the input stage.

The buffer circuit further includes a first pre-driver circuit coupled to the at least one voltage translator circuit, the first pre-driver circuit being operative to receive the first output signal and to generate a first control signal as a function thereof, and a second pre-driver circuit coupled to the at least one voltage translator circuit, the second pre-driver circuit being operative to receive the second output signal and to generate a second control signal as a function thereof. An output stage is coupled to the first and second pre-driver circuits. The output stage includes at least a first pull-up device adapted for connection between a voltage supply of the buffer circuit and an input/output pad of the buffer circuit, and at least one pull-down device adapted for connection between a voltage return of the buffer circuit and the input/output pad.

These and other features, objects and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only, and without limitation, wherein like reference numerals indicate similar elements throughout the several views of the drawings, and wherein.

DETAILED DESCRIPTION OF THE INVENTION

The present invention will be described herein in the context of illustrative I/O buffer and voltage level translator circuits. It should be understood, however, that the present invention is not limited to these or any other particular circuit arrangements. Rather, embodiments of the invention are directed broadly to techniques for beneficially translating voltages in a manner which provides a circuit with the capability to drive voltage levels higher than a maximum voltage otherwise supported by transistors used to the circuit without sustaining damage. Furthermore, the techniques presented herein do not require the use of multiple thick gate oxide transistor types, thereby reducing cost and complexity and improving yield.

Although implementations of the present invention are described herein with specific reference to p-channel metal-oxide-semiconductor (PMOS) and n-channel metal-oxide-semiconductor (NMOS) transistor devices, as may be formed using a complementary metal-oxide-semiconductor (CMOS) fabrication process, it is to be appreciated that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be understood by those skilled in the art. Moreover, although preferred embodiments of the invention are typically fabricated in a silicon wafer, embodiments of the invention can alternatively be fabricated in wafers comprising other materials, including but not limited to Gallium Arsenide (GaAs), Indium Phosphide (InP), etc.

As previously explained, the term "core transistors" may be defined as transistors comprising a relatively thin gate oxide (e.g., less than about 2 nm) and capable of supporting core voltage levels (e.g., about 1.2 volts or less) without damage. For example, an illustrative core transistor device has a gate oxide thickness of about 12 Angstrom (1.2 nm) and can support voltage levels ranging from about 0 volts to about 0.945 volts across any two terminals of the device without sustaining measurable damage. The maximum voltage associated with a core transistor may be defined as the voltage that the core transistor is designed to withstand without sustaining damage over the intended lifetime of the transistor. Damage to a transistor device may be manifested by gate oxide breakdown, substantial increase in gate oxide leakage current, and/or substantial change in a core transistor characteristic, for example, threshold voltage or transconductance. Core transistors are often used in core digital logic circuitry.

The term "thick oxide transistors," on the other hand, may be defined as transistors comprising a relatively thick gate oxide (e.g., greater than about 2.3 nm), in comparison to core transistors, and capable of supporting voltages higher than core voltages (e.g., about 1.98 volts or greater) without damage. Some voltages supported by typical thick oxide transistors are 1.98, 3.63 or 5.5 volts. Generally, the higher the supported voltage, the thicker the gate oxide that is required. For example, an illustrative thick oxide transistor device has a gate oxide thickness of about 2.6 nm and can support voltage levels ranging from about 0 volts to about 1.98 volts. The maximum voltage associated with a thick oxide transistor may be defined as the voltage that the thick oxide transistor is designed to withstand without sustaining damage over the intended lifetime of the transistor. Thick oxide transistors are often used for input, output and I/O buffers and analog applications, and are therefore sometimes referred to as I/O transistors.

Many IC fabrication processes offer two types of transistor devices, namely, core transistors and thick oxide transistors. Processes providing only a single thick oxide transistor type require the IC designer to decide which gate oxide thickness to select. This decision is often dependent on the functionality, specifications and/or other performance objectives of the IC. When a high speed interface is needed, such as, for example, double data rate-2 (DDR2) and double data rate-3 (DDR3) synchronous dynamic random-access memory (SDRAM) interfaces, it is advantageous to pick the thinnest of the thick oxide transistors available in the given IC fabrication process that will support the required voltage. The thinnest of the thick oxide transistors available will typically have the highest speed and thus support the required performance of the interface.

Some ICs have conflicting requirements pertaining to the selection of gate oxide thickness to meet prescribed speed and voltage handling requirements. For example, an IC may comprise a circuit that requires supporting 1.8-volt signal levels with high-speed (e.g., greater than one gigahertz) performance and thus require, for example, a thinner thick gate oxide transistor. However, the same IC may also comprise circuitry (e.g., I/O buffers) that requires driving a higher voltage, such as, for example, 3.63 volts, which a thinner gate oxide I/O device would not support. However, devices having a thicker gate oxide than typical thick oxide devices are generally not sufficient for high-speed operation. Examples of circuits requiring a higher voltage are circuits designed to accommodate legacy protocols, such as, for instance, advanced technology attachment (ATA) and consumer electronics advanced technology attachment (CE-ATA) which operate at 3.3 volts nominal.

Figure 1:
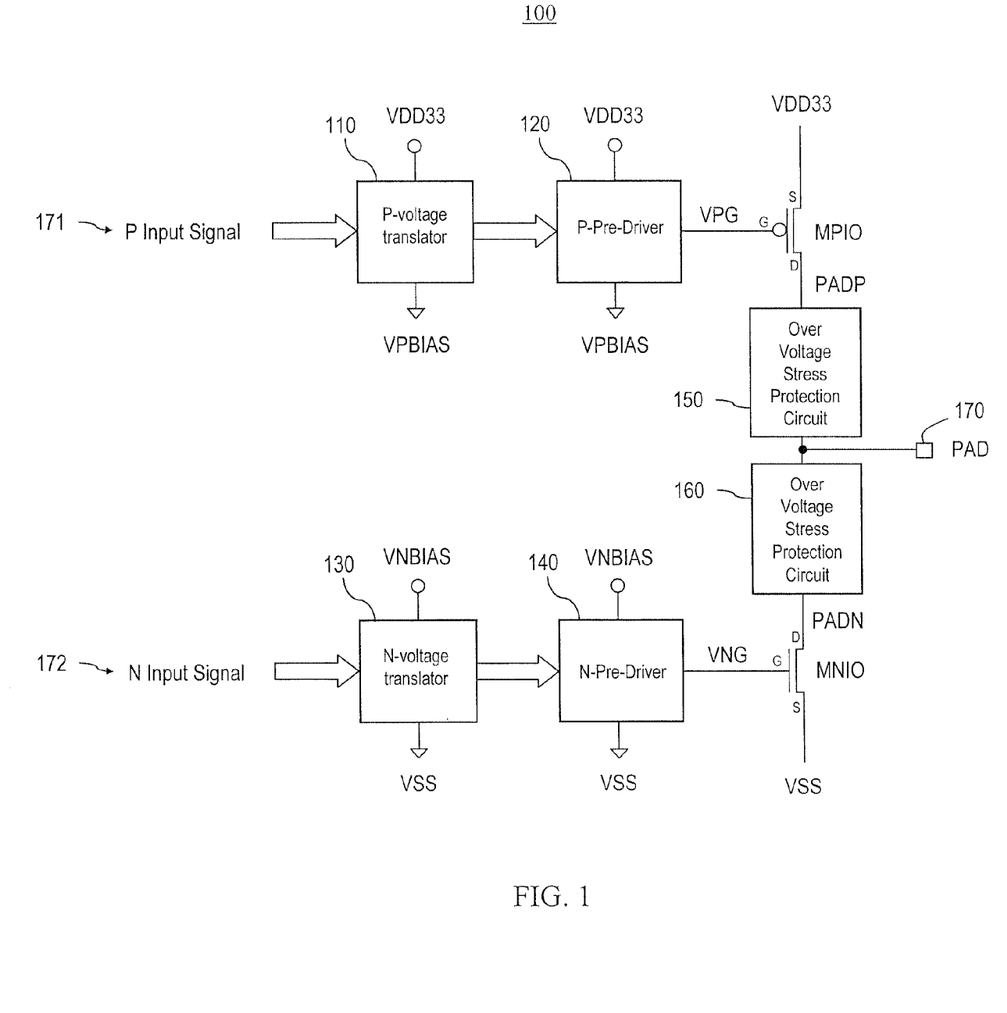
FIG. 1 illustrates a block diagram of a first output buffer comprising two separate voltage translators, one for driving a pullup transistor and one for driving a pulldown transistor.

FIG. 1 is a block diagram depicting an illustrative output buffer circuit 100. The output buffer circuit 100 includes a first voltage level translator 110, which may be a p-type voltage level translator (P-voltage translator), a first pre-driver 120, which may be a p-type pre-driver (P-pre-driver), coupled to the first voltage level translator, a second voltage level translator 130, which may an n-type voltage translator (N-voltage translator), and a second pre-driver 140, which may be an n-type pre-driver (N-pre-driver), coupled to the second voltage level translator. Output buffer 100 may further comprise a PMOS pull-up transistor, MPIO, coupled to the first pre-driver 120, a first (p-type) over-voltage stress protection circuit 150 coupled to the pull-up transistor device MPIO and to an external pad 170, which may be an I/O pad (PAD), an NMOS pull-down transistor device, MNIO, coupled to the second pre-driver 140, and a second (n-type) over-voltage stress protection circuit 160 coupled to the pull-down device MNIO and to the I/O pad. Pull-up transistor MPIO, pull-down transistor MNIO, and first and second over voltage stress protection circuits 150 and 160 form at least a portion of an output stage of the buffer circuit 100.

More particularly, first voltage level translator 110 is preferably operative to receive at least a first input signal 171, which may be a P-input signal, supplied thereto, and to generate a first level-shifted output signal that is a function of the first input signal. First pre-driver 120 is operative to receive the first level-shifted output signal and to generate a first control signal, VPG, for driving the PMOS pull-up transistor MPIO in the output stage of buffer circuit 100. A source (S) of PMOS device MPIO is adapted for connection to a first voltage source, which may be an I/O voltage supply, VDD33 (e.g., about 3.3 volts), a drain (D) of MPIO is connected to a first node of the first over-voltage protection circuit 150 at node PADP, and a gate (G) of MPIO is adapted to receive the first control signal VPG. It is to be appreciated that, because a metal-oxide-semiconductor (MOS) device is symmetrical in nature, and thus bi-directional, the assignment of source and drain designations in the MOS device is essentially arbitrary. Therefore, the source and drain may be referred to herein generally as first and second source/drain, respectively, where "source/drain" in this context denotes a source or a drain.

Likewise, second voltage level translator 130 is preferably operative to receive at least a second input signal 172, which may be an N-input signal, supplied thereto, and to generate a second level-shifted output signal that is a function of the second input signal. Second pre-driver 140 is operative to receive the second level-shifted output signal and to generate a second control signal, VNG, for driving the NMOS pull-down transistor MNIO in the output stage of buffer circuit 100. A source of NMOS device MNIO is adapted for connection to a second voltage source, which may be VSS or ground (e.g., about zero volts), a drain of MNIO is connected to a first node of the second over-voltage protection circuit 160 at node PADN, and a gate of MNIO is adapted to receive the second control signal VNG. Second nodes of the first and second over-voltage protection circuits 150 and 160, respectively, are connected together and adapted for connection to the I/O pad 170.

As apparent from the figure, the first voltage level translator 110, the first pre-driver circuit 120 and PMOS pull-up device MPIO are all preferably powered from the first voltage source, which in this illustrative embodiment is VDD33. Additionally, first voltage level translator 110 and first pre-driver 120 are coupled to a third voltage source, VPBIAS, which serves as a voltage return for the respective circuits. Thus, an output signal generated by either the first voltage level translator 110 or the first pre-driver 120 will have a maximum output voltage swing between VDD33 and VPBIAS. First voltage source VDD33 supplies, for example, a nominal voltage of about 3.3 volts. VDD33 may have a prescribed tolerance associated therewith, typically about ten percent, so that the supplied voltage VDD33 is between about 2.97 and 3.63 volts. VPBIAS is approximately VDD33−1.98 volts and therefore is preferably in a range of about 1.65 to 0.99 volts.

Similarly, the second voltage level translator 130, the second pre-driver circuit 140 and NMOS pull-down device MNIO are all preferably powered from a fourth voltage source, which in this illustrative embodiment is VNBIAS.

Additionally, second voltage level translator 130 and second pre-driver 140 are coupled to the second voltage source VSS which serves as a voltage return for the respective circuits. Thus, an output signal generated by either the second voltage level translator 130 or the second pre-driver 140 will have a maximum output voltage swing between VNBIAS and VSS. VSS preferably supplies, for example, a nominal voltage of 0 volts. Since the voltage across the gate-source terminals of NMOS device MNIO should not exceed about 1.98 volts in order to prevent damage to the NMOS device, the maximum voltage supplied by the fourth voltage source VNBIAS is preferably about 1.98 volts.

In an illustrative embodiment, the pull-up transistor MPIO is, for example, a 1.8V, 26-angstrom, thick gate oxide PMOS transistor. For this particular IC fabrication process, MPIO, being a thick gate oxide device, can tolerate about 1.98 volts (e.g., 1.8 volts plus ten percent tolerance) across any two of its terminals. The pull-down transistor MNIO is, for example, a 1.8V, 26-angstrom, thick gate oxide NMOS transistor. MNIO, being a thick gate oxide device, can tolerate about 1.98 volts (e.g., 1.8 volts plus ten percent) across any two of its terminals.

The voltage on I/O pad 170, supplied by output buffer 100, may be as high as 3.63 volts (e.g., nominal 3.3 volts plus ten percent tolerance). Therefore, the pull-down transistor MNIO must be protected from over-voltage stress, that is, any voltage over about 1.98 volts. Second over-voltage protection circuit 160 is coupled between node PADN and I/O pad 170 so that the voltage on node PADN does not exceed 1.98 volts. Similarly, the voltage on I/O pad 170, supplied by output buffer circuit 100, may be as low as 0 volts. Therefore, the pull-up transistor MPIO must be protected from over voltage stress, that is, any voltage below about VDD33 minus 1.98 volts. First over-voltage protection circuit 150 is coupled between node PADP and I/O pad 170 to ensure that the voltage on node PADP does not go below VDD33 minus 1.98 volts. Over-voltage protection circuits suitable for use in output buffer circuit 100 are known in the art.

Because the source of the pull-down transistor MNIO is at 0 volts (VSS), the voltage on either the gate or the drain (at node PADN) of MNIO should not exceed 1.98 volts. Likewise, because the source of the pull-up transistor MPIO is at 1, the voltage on either the gate of the drain (at node PADP) of MPIO should not drop below VDD33 minus 1.98 volts. Thus, the absolute value of the gate-to-source voltage, |Vgs|, of the pull-down transistor MNIO and of the pull-up transistor MPIO must not exceed 1.98 volts for this illustrative embodiment. It is to be understood that the invention is not limited to this maximum specified voltage, and that, depending upon the particular IC process technology used for fabricating the transistor devices in the output buffer circuit 100, this maximum specified voltage can be higher or lower than 1.98 volts.

Nominal core voltage level signals are, for example, about 0 volts to about 0.9 volts. Because the N-input signal 172 is assumed to be a core voltage level signal, the N-input signal 172 requires translation to a voltage level between 0 volts and VNBIAS for the n-pre-driver 140. N-voltage translator 130 is preferably operative to translate the core voltage levels, 0 volts and 0.9 volts, to corresponding voltage levels 0 volts and VNBIAS, respectively. Because P-input signal 171 is assumed to be a core voltage level signal, the P-input signal requires translation to a voltage level between VDD33 and VPBIAS for the p-pre-driver 120. P-voltage translator 110 is preferably operative to translate the core voltage levels, 0 volts and 0.9 volts, to corresponding voltage levels VPBIAS and VDD33, respectively. As shown in FIG. 1, the N-voltage translator 130 is a separate and distinct circuit from the P-voltage translator 110. The N-voltage translator 130 provides different voltage levels than the P-voltage translator 110, and therefore the N-voltage translator comprises different circuitry than the P-voltage translator.

Figure 2:
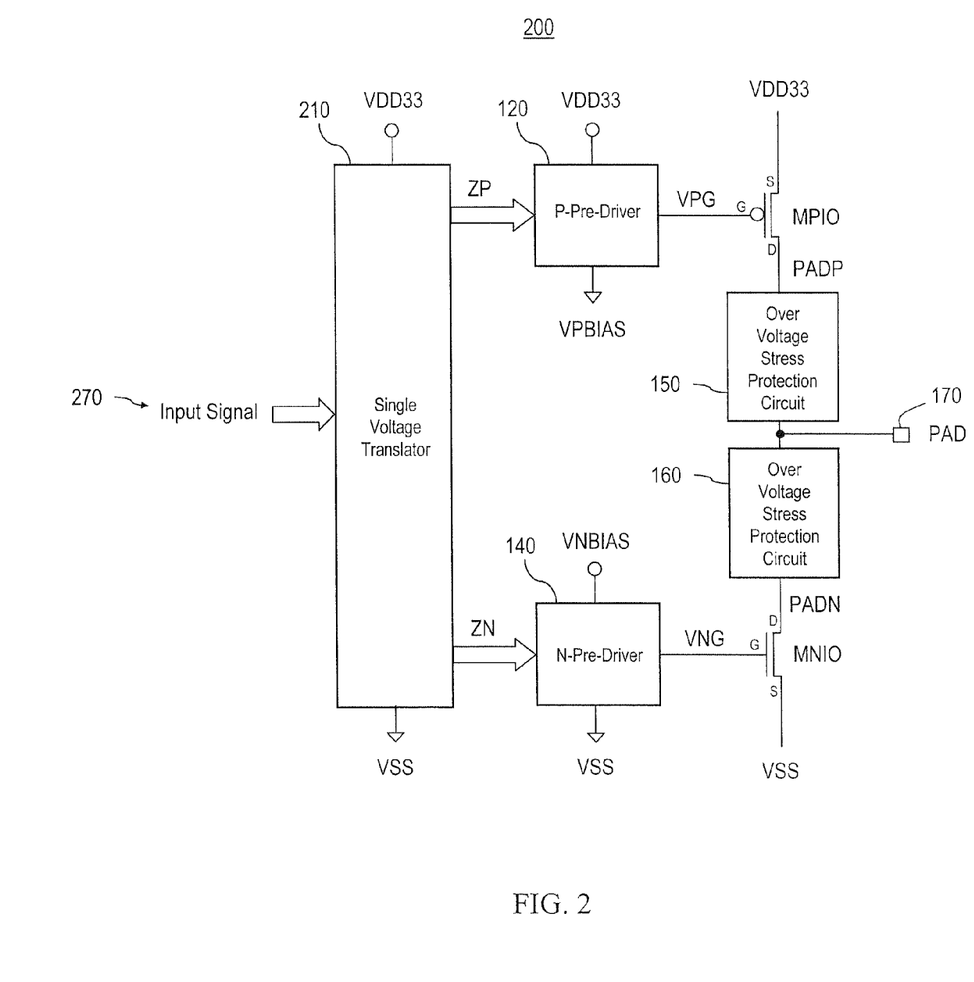
FIG. 2 is a block diagram depicting an exemplary output buffer circuit 200, according to an embodiment of the invention.

FIG. 2 is a block diagram depicting an exemplary output buffer circuit 200, according to an embodiment of the invention. The output buffer circuit 200 preferably comprises a single voltage level translator 210, a first pre-driver 120, which may be a p-type pre-driver (P-pre-driver), coupled to the voltage level translator, and a second pre-driver 140, which may be an n-type pre-driver (N-pre-driver), coupled to the voltage level translator. Output buffer 200 may further comprise a PMOS pull-up transistor, MPIO, coupled to the first pre-driver 120, a first (p-type) over-voltage stress protection circuit 150 coupled to the pull-up transistor device MPIO and to an external pad 170, which may be an I/O pad (PAD), an NMOS pull-down transistor device, MNIO, coupled to the second pre-driver 140, and a second (n-type) over-voltage stress protection circuit 160 coupled to the pull-down device MNIO and to the I/O pad. Pull-up transistor MPIO, pull-down transistor MNIO, and first and second over voltage stress protection circuits 150 and 160 form at least a portion of an output stage of the buffer circuit 200.

More particularly, voltage level translator 210 is operative to receive an input signal 270, which may be a core level input signal (e.g., about 0 to about 0.9 volts nominal), and to generate at least first and second level-shifted output signals, ZP and ZN, respectively, as a function of the input signal. First pre-driver 120 is operative to receive the first level-shifted output signal ZP and to generate a first control signal, VPG, for driving the PMOS pull-up transistor MPIO in the output stage of buffer circuit 200. A source of PMOS device MPIO is adapted for connection to a first voltage source, which may be an I/O voltage supply, VDD33 (e.g., about 3.3 volts nominal), a drain of MPIO is connected to a first node of the first over-voltage protection circuit 150 at node PADP, and a gate of MPIO is adapted to receive the first control signal VPG.

Likewise, second pre-driver 140 is operative to receive the second level-shifted output signal ZN and to generate a second control signal, VNG, for driving the NMOS pull-down transistor MNIO in the output stage of buffer circuit 200. A source of NMOS device MNIO is adapted for connection to a second voltage source, which may be VSS or ground (e.g., about zero volts nominal), a drain of MNIO is connected to a first node of the second over-voltage protection circuit 160 at node PADN, and a gate of MNIO is adapted to receive the second control signal VNG. Second nodes of the first and second over-voltage protection circuits 150 and 160, respectively, are connected together to form an output of buffer circuit 200 and are adapted for connection to the I/O pad 170.

By way of example only, the pull-up transistor MPIO is preferably a 1.8-volt, 26-angstrom, p-channel, thick gate oxide field-effect transistor, although the invention is not limited to this specific device type and/or IC process technology. In this illustrative example, the pull-up transistor MPIO can tolerate 1.98 volts (1.8 volts plus ten percent tolerance) across any pair of its terminals. Similarly, the pull-down transistor MNIO is preferably a 1.8-volt, 26-angstrom, n-channel, thick gate oxide field-effect transistor, although the invention is not limited to this specific device type and/or IC process technology. In this illustrative example, the pull-down transistor MNIO can tolerate 1.98 volts across any pair of its terminals.

In this illustration, the voltage on I/O pad 170, provided by the output stage of output buffer circuit 200, may be as high as about 3.63 volts (e.g., the sum of the nominal 3.3 volts plus ten percent tolerance). Therefore, the pull-down transistor MNIO will require protection from over-voltage stress, that is, any voltage over about 1.98 volts in this example. Second over-voltage protection circuit 160 is coupled between node PADN and I/O pad 170 so that the voltage on node PADN does not exceed 1.98 volts. Similarly, the voltage on I/O pad 170, supplied by output buffer circuit 200, may be as low as 0 volts. Therefore, the pull-up transistor MPIO will require protection from over voltage stress, that is, any voltage below about VDD33 minus 1.98 volts. First over-voltage protection circuit 150 is coupled between node PADP and I/O pad 170 to ensure that the voltage on node PADP does not go below VDD33 minus 1.98 volts.

Because the source of the pull-down transistor MNIO is at 0 volts (VSS), the voltage on either the gate or the drain (at node PADN) of MNIO should not exceed 1.98 volts. Likewise, because the source of the pull-up transistor MPIO is at VDD33, the voltage on either the gate of the drain (at node PADP) of MPIO should not drop below VDD33 minus 1.98 volts. Thus, the absolute value of the gate-to-source voltage, |Vgs|, of the pull-down transistor MNIO and of the pull-up transistor MPIO must not exceed 1.98 volts for this illustrative embodiment. It is to be understood that the invention is not limited to this maximum specified voltage, and that, depending upon the particular IC process technology used for fabricating the transistor devices in the output buffer circuit 200, this maximum specified voltage can be higher or lower than 1.98 volts.

Voltage level translator 210, the first pre-driver circuit 120 and PMOS pull-up device MPIO are all preferably powered from the first voltage source, which in this illustrative embodiment is VDD33. Additionally, the first pre-driver 120 is coupled to a third voltage source, VPBIAS, which serves as a voltage return for the first pre-driver. Thus, an output signal generated by the first pre-driver 120 will have a maximum output voltage swing between VDD33 and VPBIAS. First voltage source VDD33 supplies, for example, a nominal voltage of about 3.3 volts. VDD33 may have a prescribed tolerance associated therewith, typically about ten percent, so that the supplied voltage VDD33 is between about 2.97 and 3.63 volts. VPBIAS is approximately VDD33−1.98 volts, and therefore is preferably in a range of about 1.65 to 0.99 volts.

Similarly, the voltage level translator 210, the second pre-driver circuit 140 and NMOS pull-down device MNIO are all coupled to the second voltage source VSS which serves as a voltage return for the respective circuits. Additionally, second pre-driver 140 is preferably powered from a fourth voltage source, which in this illustrative embodiment is VNBIAS. Thus, an output signal generated by the second pre-driver 140 will have a maximum output voltage swing between VNBIAS and VSS. VSS preferably supplies, for example, a nominal voltage of 0 volts. Since the voltage across the gate-source terminals of NMOS device MNIO should not exceed about 1.98 volts in order to prevent damage to the NMOS device (in this illustrative embodiment), the maximum voltage supplied by the fourth voltage source VNBIAS is preferably about 1.98 volts.

Nominal core voltage level signals are, for example, about 0 volts to about 0.9 volts. Because input signal 270 is assumed to be a core voltage level signal, the input signal requires translation to a voltage level between 0 volts and VNBIAS suitable for driving the n-pre-driver 140. The single voltage translator 210 is preferably operative to translate the core voltage levels, 0 volts and 0.9 volts, to 0 volts and VNBIAS volts, respectively. Voltage translator 210 is further operative to translate the input signal 270 to a voltage level between VDD33 and VPBIAS suitable for driving the p-pre-driver 120. The single voltage translator 210 translates the core voltage levels, 0 volts and 0.9 volts, to VPBIAS and VDD33, respectively. As shown in FIG. 2, the single voltage translator 210 provides the translated voltages to both the p-pre-driver 120 and the n-pre-driver 140.

Figure 3:
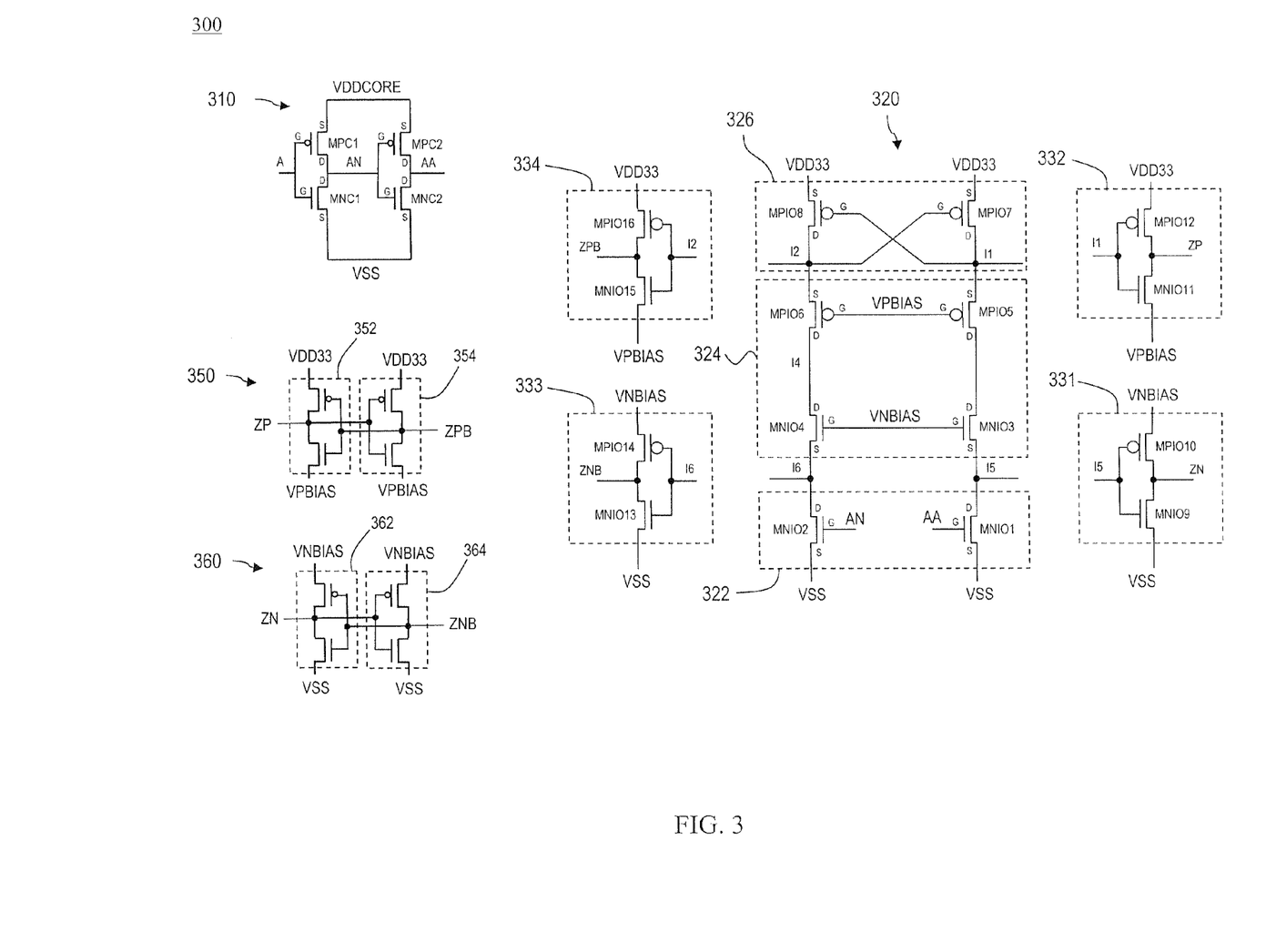
FIG. 3 is an electrical schematic diagram depicting at least a portion of an exemplary composite voltage translator circuit, according to an embodiment of the present invention.

FIG. 3 is a schematic diagram depicting at least a portion of an exemplary composite voltage translator circuit 300, according to an embodiment of the invention. Composite voltage translator 300 may be suitable for use, for example, in the single voltage translator 210 shown in the illustrative buffer circuit 200 (see FIG. 2). Voltage level translator circuit 300 can be used to translate an input signal (e.g., signal A) which is referenced to a lower core voltage supply, such as, for example, VDDCORE, to first and second output signals, ZP and ZN, which are referenced to different supply voltages. For example, in this illustrative embodiment, output signal ZP is referenced to voltage supplies VDD33 and VPBIAS, and output signal ZN is referenced to voltage supplies VNBIAS and VSS. In many applications, the lower core voltage supply VDDCORE is typically about 0.9 volt and the higher voltage supply VDD33 is typically about 3.3 volts. It is to be understood, however, that the present invention is not limited to these or to any particular voltage levels.

Composite voltage translator circuit 300 preferably comprises a voltage level translation circuit 320 including an input stage 322, a voltage clamp 324 coupled to the input stage, and a latch 326 coupled to the voltage clamp. The input stage 322 preferably comprises a differential input stage operative to receive a first signal, AN, and a second signal, AA. As apparent from the figure, signal AN is a logical complement of input signal A supplied to circuit 300, such that when signal A is a logic high level, signal AN is a logic low level, and vice versa. Signal AA is preferably a buffered version of input signal A, such that when signal A is a logic high level, signal AA is also a logic high level, and vice versa. Signals AN and AA may be generated, for example, by a buffer circuit 310 which includes a pair of inverters coupled together in series.

Specifically, buffer circuit 310 comprises a first PMOS transistor device, MPC1, a second PMOS transistor device, MPC2, a first NMOS transistor device, MNC1, and a second NMOS transistor device, MNC2. Sources of devices MPC1 and MPC2 are adapted for connection to the lower core voltage supply VDDCORE (e.g., about 0.9 volt nominal), or an alternative voltage supply, and sources of devices MNC1 and MNC2 are adapted for connection to voltage return VSS, or an alternative voltage reference source. Gates of MPC1 and MNC1 are connected together and form an input of the buffer circuit 310 for receiving the input signal A, and drains of MPC1 and MNC1 are connected together and form an output of the first inverter for generating the signal AN. Gates of MPC2 and MNC2 are connected together and form an input of the second inverter for receiving signal AN, and drains of MPC2 and MNC2 are connected together and form an output of the buffer circuit 310 for generating the signal AA. Although not required, the second inverter, comprising devices MPC2 and MNC2, serves to buffer input signal A and to ensure that rise and fall times of the resulting signal AA are more closely matched to rise and fall times of signal AN. Devices MPC1, MPC2, MNC1 and MNC2 are preferably core transistors, since the highest voltage expected across any two terminals of a given one of the transistors in buffer circuit 310 is about VDDCORE.

Input stage 322 preferably comprises first and second NMOS transistor devices, MNIO1 and MNIO2, respectively. Sources of devices MNIO1 and MNIO2 are adapted for connection to VSS, a drain of MNIO1 is connected to a first node of the voltage clamp 324 (node I5), a gate of MNIO1 is adapted for receiving core signal AA, a drain of MNIO2 is connected to a second node of the voltage clamp (node I6), and a gate of MNIO2 is adapted for receiving core signal AN. Devices MNIO1 and MNIO2 are preferably thick oxide devices. It is to be understood that alternative input stage configurations are similarly contemplated by the invention.

Latch 326 preferably comprises first and second PMOS transistor devices, MPIO7 and MPIO8, respectively, connected in a cross-coupled arrangement. Specifically, sources of MPIO7 and MPIO8 are adapted for connection to the higher voltage supply VDD33 (e.g., about 3.3 volts nominal), a drain of MPIO7 is connected to a third node of the voltage clamp 324 (node I1), a drain of MPIO8 is connected to a fourth node of the voltage clamp (node I2), a gate of MPIO7 is connected to the drain of MPIO8 at node I2, and a gate of MPIO8 is connected to the drain of MPIO7 at node I1. Latch 326 is operative to at least temporarily store a logic state of the input signal A. Devices MPIO7 and MPIO8 are preferably thick oxide devices. It is to be understood that alternative latch arrangements are similarly contemplated by the invention.

Voltage clamp 324 is coupled between input stage 322 and latch 326 and is preferably operative to set a maximum voltage across the latch to a first prescribed level and to set a maximum voltage across the input stage to a second prescribed level. More particularly, voltage clamp 324 preferably comprises first and second NMOS transistor devices, MNIO3 and MNIO4, respectively, and first and second PMOS transistor devices, MPIO5 and MPIO6, respectively. A source of MNIO3 is connected to the input stage 322 at node I5, a source of MNIO4 is connected to the input stage at node I6, and the gates of MNIO3 and MNIO4 are connected together and adapted to receive a first bias signal, VNBIAS, which may be a supply voltage of N-pre-driver 140 shown in FIG. 2. This ensures that the maximum voltage present at nodes I5 or I6 is about $VNBIAS-V_{T_n}$, where $V_{T_n}$ is a threshold voltage of NMOS devices MNIO3 or MNIO4, respectively.

Similarly, a source of MPIO5 is connected to the latch 326 at node I1, a source of MPIO6 is connected to the latch at node I2, and gates of MPIO5 and MPIO6 are connected together and adapted to receive a second bias signal, VPBIAS, which may be a supply voltage of P-pre-driver 120 shown in FIG. 2. This ensures that the minimum voltage present at nodes I1 or I2 is about $VPBIAS+V_{T_p}$, where $V_{T_p}$ is a threshold voltage of PMOS devices MPIO5 or MPIO6, respectively. Drains of MNIO3 and MPIO5 are connected together at node I3, and drains of MNIO4 and MPIO6 are connected together at node I4. It is to be understood that alternative voltage clamp configurations are similarly contemplated by the invention. Devices MNIO3, MNIO4, MPIO5 and MPIO6, like the devices in the input stage 322 and latch 326, are preferably thick oxide devices, such as, for example, thick gate oxide transistors comprising 26 Angstrom gate oxides capable of supporting about 1.98 volts.

In accordance with an embodiment of the invention, first and second bias signals VNBIAS and VPBIAS, respectively, may be connected to the same voltage source (e.g., about VDD33/2). It is to be appreciated that the invention is not limited to any specific voltage(s) for VNBIAS and VPBIAS.

Preferably, composite voltage translator circuit 300 comprises a first output buffer 331, a second output buffer 332, a third output buffer 333, and a fourth output buffer 334. Although first, second, third and fourth output buffers 331, 332, 333 and 334, respectively, are depicted as inverting buffers, one or more of the output buffers may, alternatively, be non-inverting, as will be understood by those skilled in the art (e.g., by adding an inverter to an output node of a given one of the respectively output buffers). Output buffers 331, 332, 333 and 334 are coupled to nodes I5, I1, I6 and I2, respectively, of voltage clamp 324 and are operative to buffer the respective output signals generated at these nodes. The output buffers 331, 332, 333, 334 further protect the corresponding nodes of the voltage clamp 324 to which they are connected from undesirable loading effects caused by another circuit or circuits coupled to the voltage translator circuit 300. In this manner, output buffers 331, 332, 333, 334 advantageously provide symmetry to the voltage level translation circuit 320, at least in terms of performance and load. It is to be understood that the invention is not limited to the particular buffer circuit arrangements shown.

More particularly, first output buffer 331 comprises an NMOS transistor device, MNIO9, and a PMOS transistor device, MPIO10, connected as a standard inverter. An input of buffer 331 is coupled to node I5 of the voltage clamp 324 and is operative to generate a first output signal, ZN. Second output buffer 332 comprises an NMOS transistor device, MNIO11, and a PMOS transistor device, MPIO12, connected as a standard inverter. An input of buffer 332 is coupled to node I1 of the voltage clamp 324 and is operative to generate a second output signal, ZP. Third output buffer 333 comprises an NMOS transistor device, MNIO13, and a PMOS transistor device, MPIO14, connected as a standard inverter. An input of buffer 333 is coupled to node I6 of the voltage clamp 324 and is operative to generate a third output signal, ZNB, which is logical complement of output signal ZN. Fourth output buffer 334 comprises an NMOS transistor device, MNIO15, and a PMOS transistor device, MPIO16, connected as a standard inverter. An input of buffer 334 is coupled to node I2 of the voltage clamp 324 and is operative to generate a fourth output signal, ZPB, which is logical complement of output signal ZP.

Optionally, voltage translator circuit 300 may comprise a first output latch 350 and a second output latch 360. Each of the first and second output latches 350 and 360, respectively, preferably includes a pair of inverters connected in a cross-coupled configuration and is operative to at least temporarily store a logic state of one or more of the output signals generated by the voltage translator circuit 300. Specifically, first latch 350 preferably comprises first and second inverters, 352 and 354, respectively. An input of the first inverter 352 is coupled to an output of the second inverter 354 and is adapted to receive the fourth output signal ZPB generate by buffer 334. An input of the second inverter 354 is coupled to an output of the first inverter 352 and is adapted to receive the second output signal ZP generated by buffer 332. Likewise, second latch 360 preferably comprises first and second inverters, 362 and 364, respectively. An input of the first inverter 362 is coupled to an output of the second inverter 364 and is adapted to receive the third output signal ZNB generate by buffer 333. An input of the second inverter 364 is coupled to an output of the first inverter 362 and is adapted to receive the first output signal ZN generated by buffer 331. First latch 350 is preferably powered by VDD33 and VPBIAS, and second latch 360 is powered by VNBIAS and VSS, as shown. In this manner, the first and second latches 350, 360 beneficially improve duty cycle distortion in the voltage translator circuit 300.

In terms of operation, voltage level translation circuit 320 comprises first and second conduction paths between VSS and VDD33. The first conduction path comprises transistors MNIO1, MNIO3, MPIO5 and MPIO7. The second conduction path comprises transistors MNIO2, MNIO3, MPIO6 and MPIO8. When the buffered input signal AA transitions from low to high at substantially the same time that the inverted input signal AN transitions from high to low, the first conduction path is established momentarily until node I2 is pulled high by MPIO8. After node I2 is pulled high, the first conduction path is terminated by MPIO7. When the buffered input signal AA transitions from high to low at substantially the same time that the inverted input signal AN transitions from low to high, the second conduction path is established momentarily until node I1 is pulled high by MPIO7. After node I1 is pulled high, the second conduction path is terminated by MPIO8. When the buffered input signal AA and the inverted input signal AN remain stable, there is essentially no current flowing in either the first or the second conduction paths, except possibly leakage currents.

Figure 4:
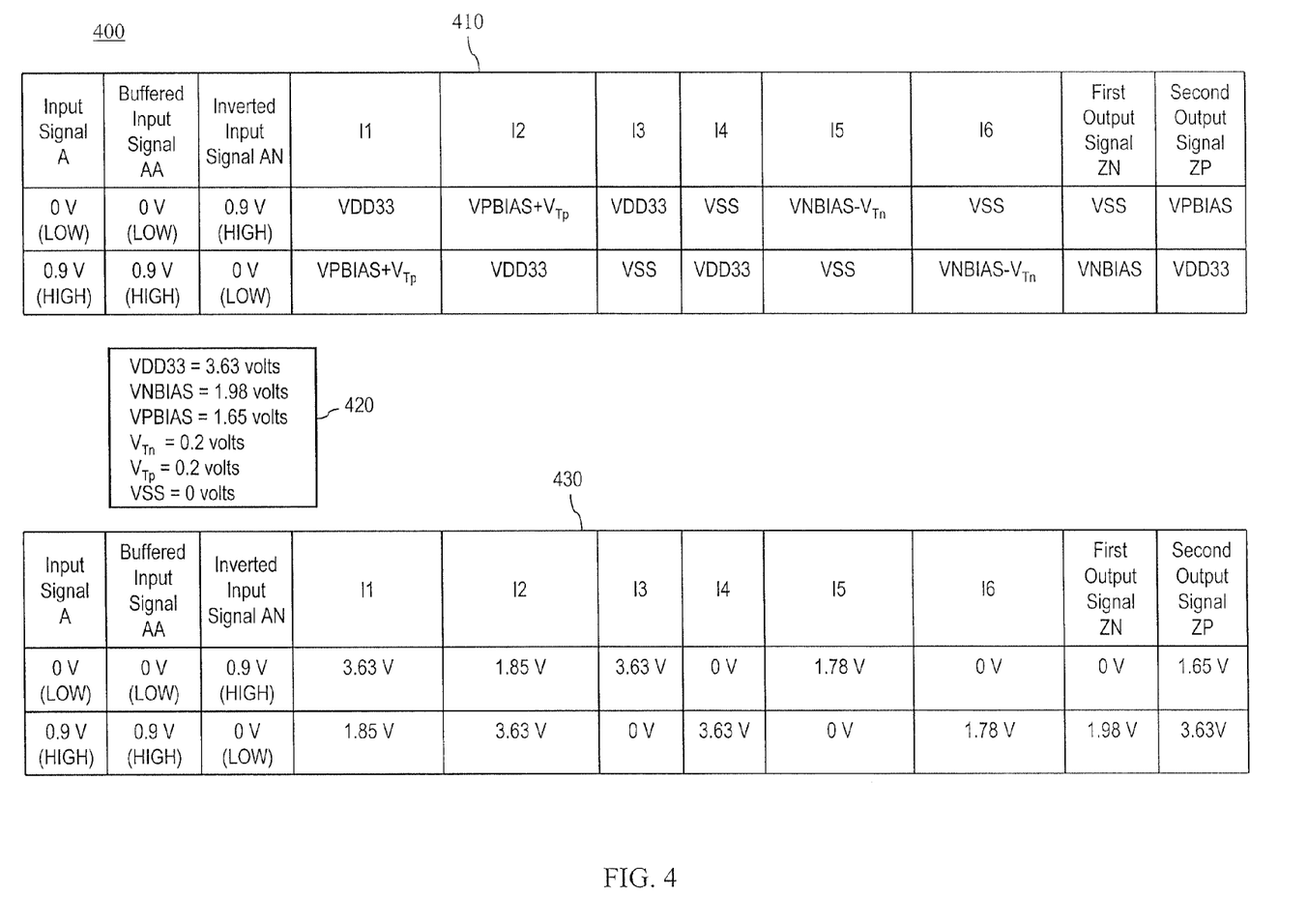
FIG. 4 illustrates exemplary voltage levels for certain input, output and internal nodes of the composite voltage translator circuit shown in FIG. 3, according to an embodiment of the present invention.

More particularly, by way of example only and without loss of generality, FIG. 4 shows exemplary voltage levels for illustrative input signals, output signals and internal nodes of the composite voltage translator circuit 300 shown in FIG. 3, according to an aspect of the present invention. A first table 410 presents input signal voltage levels and corresponding node voltages and output signal voltage levels for the voltage translator circuit 300 in terms of general voltage supply levels (e.g., VDD33, VPBIAS, VNBIAS, VSS) and threshold voltages (e.g., $V_{Tn}$, $V_{Tp}$). A second table 430 presents input signal voltage levels and corresponding node voltages and output signal voltage levels in terms of actual voltage values. In generating the voltage values shown in table 430, exemplary voltages of the various voltage supplies and transistor thresholds are assumed to be as indicated in table 420.

As apparent from FIG. 4, the nodes within the voltage translator circuit 300 reside at voltages corresponding to two logic levels. The logic levels are referred to herein as a low logic level and a high logic level. These logic levels correspond to voltages; for example, the low logic level corresponds to VSS, which may be approximately ground or 0 volt, and the high logic level corresponds to VDD33, which may be about 3.3 volts nominal (3.63 volts maximum). The input signal A to the voltage translator circuit 300, as well as inverted input signal AN and buffered input signal AA supplied to the voltage level translation circuit 320 (FIG. 3), may be referenced to different voltage supplies. Thus, in the present example, a logic low level (LOW) input signal corresponds to about 0 volt nominal and a logic high level (HIGH) input signal corresponds to about 0.9 volt nominal.

With reference again to FIG. 3, consider the case when the input signal A is high, and therefore the buffered input signal AA is high and the inverted input signal AN is low. Signal AA being high turns on NMOS device MNIO1 and node I5 is pulled low (e.g., to VSS). Since NMOS device MNIO3 will be turned on (assuming VNBIAS is greater than about an NMOS transistor threshold voltage $V_{Tn}$), node I3 will be pulled low. Since PMOS device MPIO5 is turned on by VPBIAS, the voltage at node I1 will be a PMOS transistor threshold voltage ($V_{Tp}$) above VPBIAS. This, in turn, will turn on PMOS device MPIO8, thereby pulling node I2 high (e.g., to VDD33). Node I2 being high turns off PMOS device MPIO7, thereby allowing node I1 to be controlled by MPIO5 essentially without interference.

Since PMOS device MPIO6 is turned on by VPBIAS, node I4 will be pulled high to about VDD33. Signal AN being low turns off MNIO2, thereby allowing node I6 to be controlled by NMOS device MNIO4 essentially without interference. With MNIO4 turned on as a result of signal VNBIAS supplied to the gate thereof, node I6 would otherwise be pulled to VDD33. However, the gate voltage VNBIAS on MNIO4 prevents node I6 from exceeding a threshold voltage below VNBIAS (i.e., VNBIAS−$V_{Tn}$), thereby protecting NMOS device MNIO2 from sustaining damage. Thus, under the condition when input signal A is high, the maximum voltage across any two terminals of devices MNIO1 or MNIO2 will be about VNBIAS−$V_{Tn}$, and the maximum voltage across any two terminals of devices MNIO3 or MNIO4 will be about VDD33−(VNBIAS+$V_{Tp}$), which will be less than about 2.0 volts for the illustrative case shown in FIG. 4. Similarly, the maximum voltage across any two terminals of devices MPIO5 or MPIO6 will be about VDD33−(VPBIAS+$V_{Tp}$), which will be less than about 2.0 volts, and the maximum voltage across any two terminals of devices MPIO7 or MPIO8 will be about VPBIAS+$V_{Tp}$, which will be about 2.0 volts.

Likewise, consider the case when the input signal A is low, and therefore the buffered input signal AA is low and the inverted input signal AN is high. Signal AN being high turns on MNIO2 and node I6 is pulled low (e.g., to VSS). MNIO4 will be turned on (assuming VNBIAS is greater than about an NMOS threshold voltage $V_{Tn}$), and therefore node I4 will be pulled low. Since MPIO6 is turned on by VPBIAS, the voltage at node I2 will be a PMOS threshold voltage ($V_{Tp}$) above VPBIAS. This, in turn, will turn on MPIO7, thereby pulling node I1 high (e.g., to VDD33). Node I1 being high turns off MPIO8, thereby allowing node I2 to be controlled by MPIO6 essentially without interference.

Since MPIO5 is turned on by VPBIAS, node I3 will be pulled high (e.g., to about VDD33). Signal AA being low turns off MNIO1, thereby allowing node I5 to be controlled by MNIO3 essentially without interference. With MNIO3 turned on as a result of VNBIAS supplied to the gate thereof, node I5 would otherwise be pulled to VDD33. However, the gate voltage VNBIAS on MNIO3 prevents node I5 from exceeding a threshold voltage below VNBIAS (i.e., VNBIAS−$V_{Tn}$), thereby protecting MNIO1 from sustaining damage. Thus, when input signal A is low, like the condition when signal A is high, the maximum voltage across any two terminals of devices MNIO1 or MNIO2 will be about VNBIAS−$V_{Tn}$, and the maximum voltage across any two terminals of devices MNIO3 or MNIO4 will be about VDD33−(VNBIAS+$V_{Tp}$), which would be less than about 2.0 volts for the illustrative case shown in FIG. 4.

The illustrative voltage values shown in table 430 of FIG. 4 are based on the assumption that VSS is about 0 volt, VDD33 is about 3.63 volts maximum (e.g., 3.3 volts plus ten percent), VNBIAS is about 1.98 volts maximum (e.g., 1.8 volts plus ten percent), VPBIAS is about 1.65 volts minimum (e.g., 1.8 volts minus ten percent), and NMOS and PMOS threshold voltages, $V_{Tn}$ and $V_{Tp}$, respectively, are about 0.2 volt for each of the thick oxide transistors. Thus, for the case when the input signal A is low (e.g., about 0 volt), signal AA will be about 0 volt, signal AN will be about 0.9 volt, node I1 will be about 3.63 volts, node I2 will be about 1.85 volts, node I3 will be about 3.63 volts, node I4 will be about 0 volt, node I5 will be about 1.78 volts, node I6 will be about 0 volt, output signal ZN will be about 0 volt, and output signal ZP will be about 1.65 volts. Similarly, for the case when signal A is high (e.g., about 0.9 volt), signal AA will be about 0.9 volt, signal AN will be about 0 volt, node I1 will be about 1.85 volts, node I2 will be about 3.63 volts, node I3 will be about 0 volt, node I4 will be about 3.63 volts, node I5 will be about 0 volt, node I6 will be about 1.78 volts, output signal ZN will be about 1.98 volts, and output signal ZP will be about 3.63 volts. It is to be understood that these voltage values are merely illustrative, and that the invention is not limited to any particular voltage values.

Figure 5:
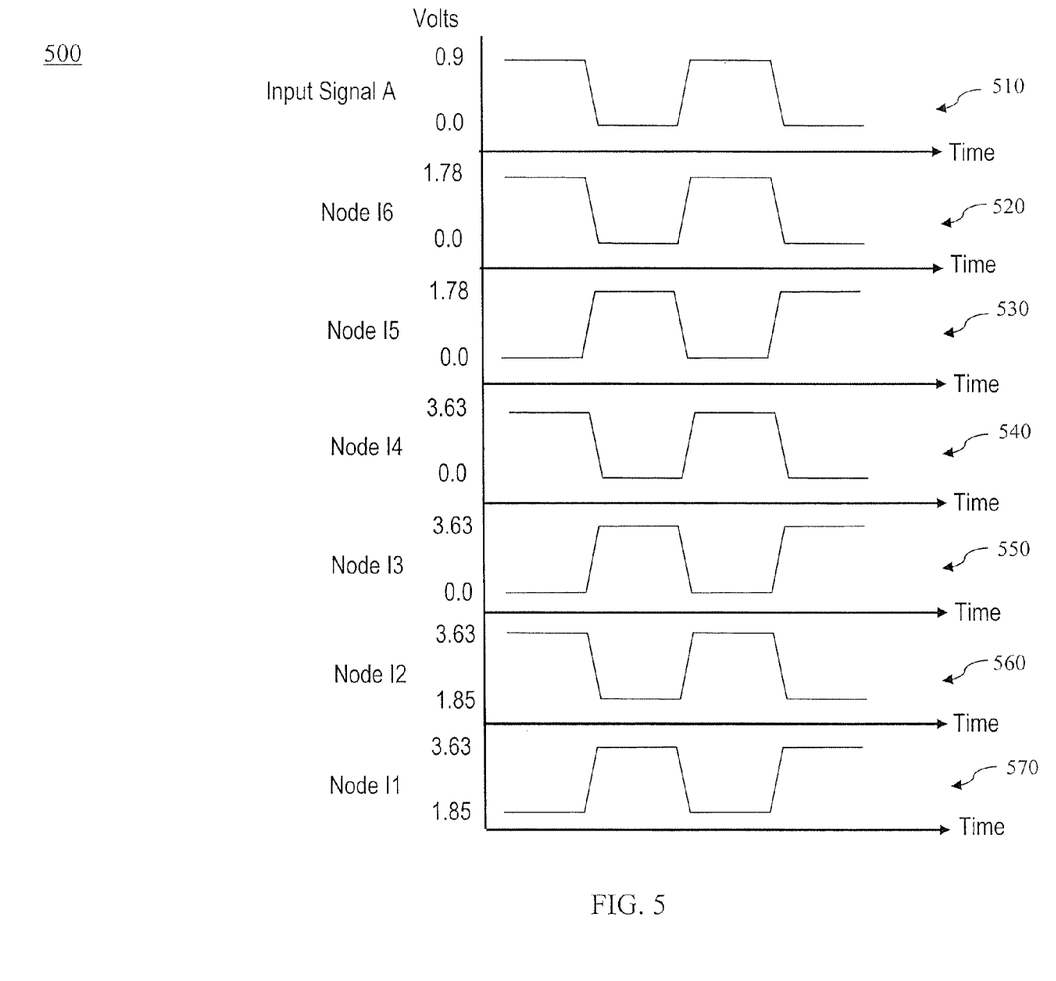
FIG. 5 illustrates exemplary waveforms corresponding to the composite voltage translator circuit shown in FIG. 3, according to an embodiment of the present invention.

FIG. 5 depicts exemplary waveforms 500 corresponding to the composite voltage translator circuit 300 shown in FIG. 3 under worst-case fast conditions. The waveforms 500 corre-spond to the illustrative voltages shown in tables 420 and 430 of FIG. 4. Waveform 510 represents the input signal A toggling between low (e.g., 0 volt) and high (e.g., 0.9 volt) logic states. The remaining waveforms correspond to internal nodes of the voltage level translation circuit 320 (FIG. 3). Specifically, waveform 520 represents node I6, waveform 530 represents node I5, waveform 540 represents node I4, waveform 550 represents node I3, waveform 560 represents node I2, and waveform 570 represents node I1 of voltage level translation circuit 320. The voltages in each waveform (y-axis) are labeled in units of volts, and each of the waveforms is referenced to some arbitrary unit of time (x-axis).

Figure 6:
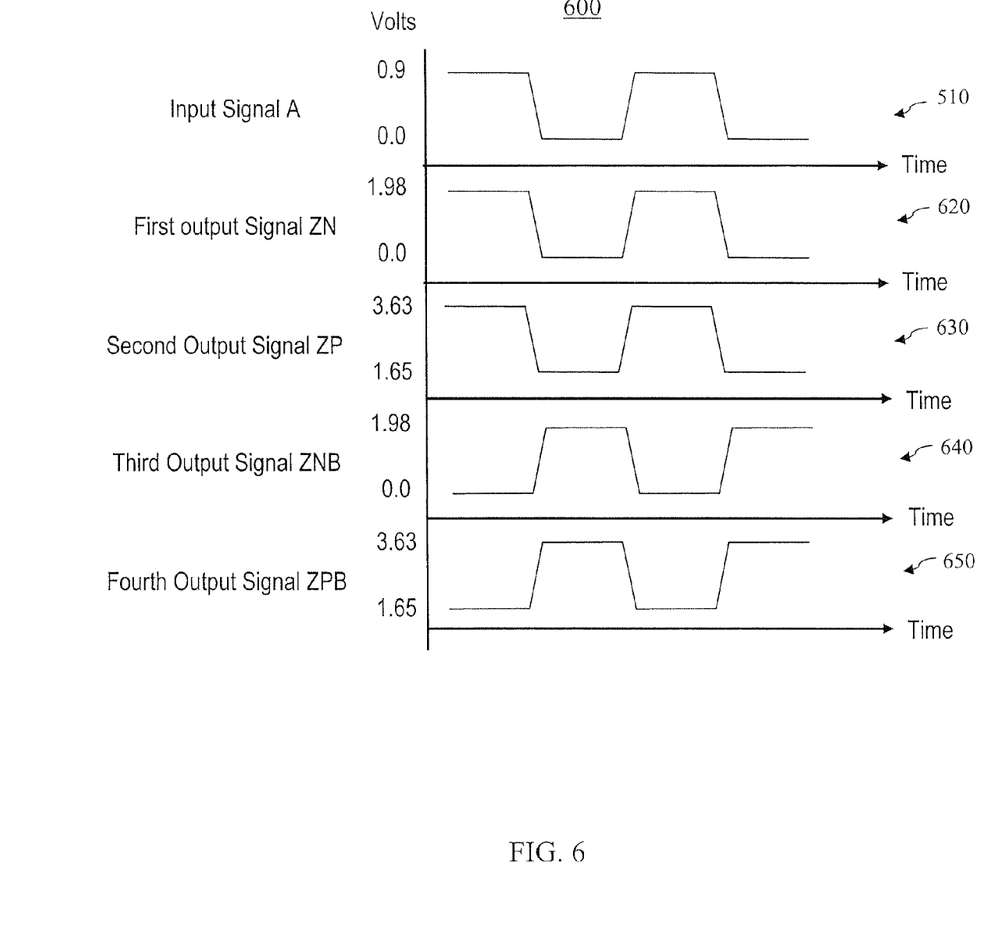
FIG. 6 illustrates additional exemplary waveforms corresponding to the composite voltage translator circuit shown in FIG. 3, according to an embodiment of the present invention.

FIG. 6 shows additional exemplary waveforms 600 corresponding to the composite voltage translator circuit 300 shown in FIG. 3 under worst-case fast conditions. The waveforms 600 correspond to the illustrative voltages shown in tables 420 and 430 of FIG. 4. The first waveform 510 represents the input signal A toggling between low (e.g., 0 volt) and high (e.g., 0.9 volt) logic states. The remaining waveforms correspond to output signals generated by the composite voltage translator circuit 300. Specifically, waveform 620 represents output signal ZN generated by first output buffer 331, waveform 630 represents output signal ZP generated by second output buffer 332, waveform 640 represents output signal ZNB generated by third output buffer 333, and waveform 650 represents output signal ZPB generated by fourth output buffer 334 of the composite voltage translator circuit 300 (FIG. 3). As apparent from FIG. 6, output signals ZN and ZNB toggle between VSS and VNBIAS as a function of the input signal A, and output signals ZP and ZPB toggle between VDD33 and VPBIAS as a function of the input signal A. The voltages in each waveform (y-axis) are labeled in units of volts, and each of the waveforms is referenced to some arbitrary unit of time (x-axis).

Figure 7:
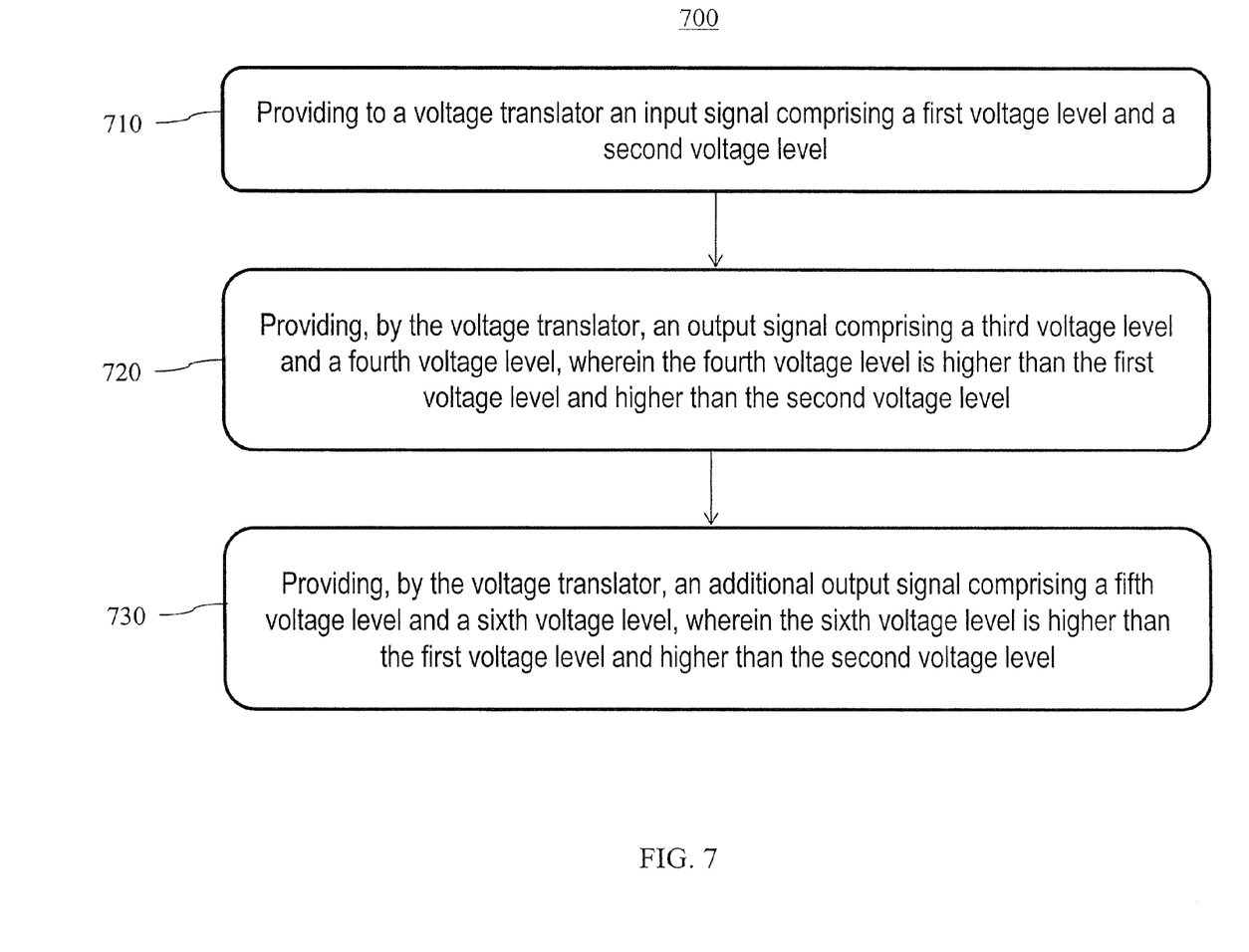
FIG. 7 is a logical flow diagram depicting an exemplary method for translating signal voltage levels, according to an embodiment of the present invention.

FIG. 7 is a logical flow diagram depicting an exemplary method 700 for translating signal voltage levels, according to an embodiment of the present invention. In step 710, an input signal referenced with respect to a first voltage level, which may be ground or VSS, and a second voltage level, which may be a core voltage supply, VDDCORE, is provided to a voltage translator circuit (e.g., circuit 300 shown in FIG. 3). The input signal may toggle, for example, between about 0 volts and 0.9 volts, although the invention is not limited to any specific voltage levels.

In step 720, the voltage translator circuit preferably generates, as a function of the input signal, at least a first output signal referenced with respect to a third voltage level, which may be a P-bias voltage, VPBIAS, and a fourth voltage level, which may be an I/O voltage supply, VDD33. For example, the first output signal may toggle between the third voltage level of about 1.65 volts and the fourth voltage level of about 3.63 volts, although the invention is not limited to any specific voltage levels.

In step 730, the voltage translator circuit generates, as a function of the input signal, at least a second output signal referenced with respect to a fifth voltage level, which may be an N-bias voltage, VNBIAS, and a sixth voltage level, which may be ground or VSS. For example, the second output signal may toggle between the fifth voltage level of about 0 volts and the sixth voltage level of about 1.98 volts, although the invention is not limited to any specific voltage levels.

At least a portion of the techniques of the present invention may be implemented in one or more ICs. In forming ICs, die are typically fabricated in a repeated pattern on a surface of a semiconductor wafer. Each of the die includes a device described herein, and may include other structures or circuits. Individual die are cut or diced from the wafer, then packaged as integrated circuits. One skilled in the art would know how to dice wafers and package die to produce integrated circuits. Integrated circuits so manufactured are considered part of this invention.

Figure 8:
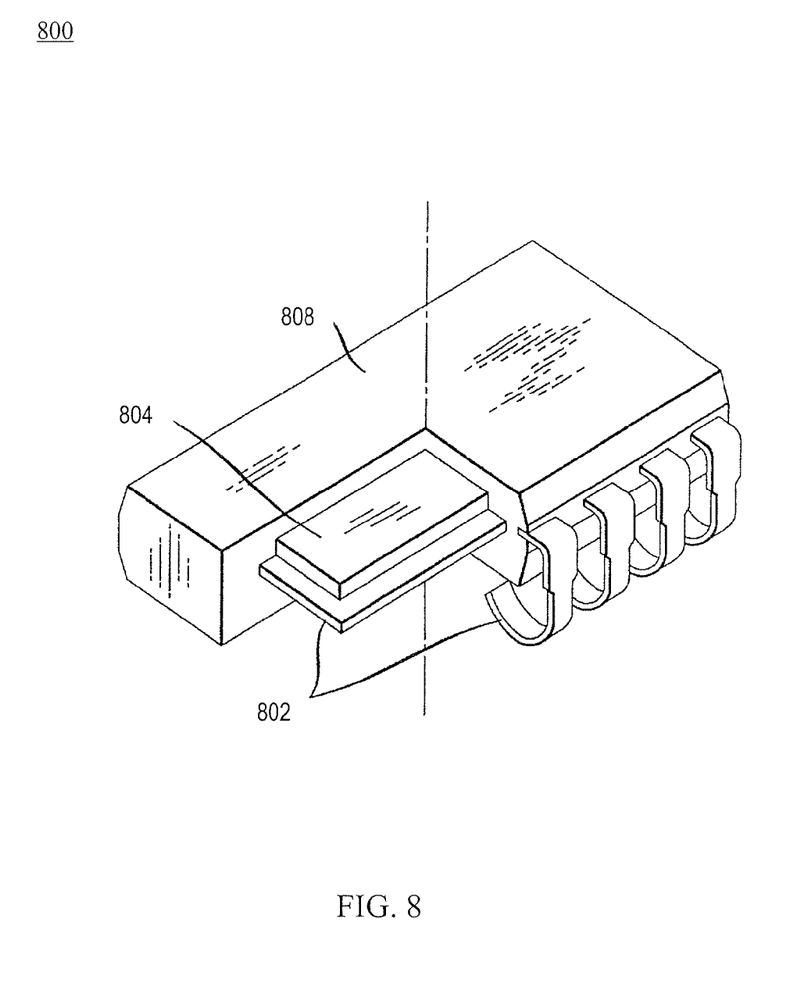
FIG. 8 is a partial cut-away view depicting an exemplary packaged IC device comprising a composite voltage translator circuit formed in accordance with an embodiment of the present invention.

FIG. 8 is a partial cut-away view depicting an exemplary packaged IC device 800 comprising a voltage translator circuit according to an embodiment of the present invention. The packaged IC device 800 comprises a leadframe 802, a die 804 attached to the leadframe and a plastic encapsulation mold 808 surrounding the die and leadframe. Although the figure depicts only one type of IC package, the invention is not so limited; rather, the invention may comprise an IC die enclosed in any package type (e.g., ceramic, ball grid array (BGA), quad flat pack (QFP), etc.).

The die 804 comprises at least one voltage translator circuit according to an embodiment of the invention, such as, for example, one or more of the embodiments depicted in FIGS. 2 and 3. For example, in one embodiment, the die 804 comprises a single voltage translator (e.g. 210 in FIG. 2). In another embodiment, the die 804 preferably comprises the composite voltage translator circuit 300 shown in FIG. 3. In yet another embodiment, the die 804 comprises an output buffer (e.g., 200 in FIG. 2) comprising the composite voltage translator circuit.

An IC in accordance with the present invention can be employed in essentially any application and/or electronic system. Suitable systems for implementing aspects of the invention may include, but are not limited to, personal computers, communication networks, portable communications devices (e.g., cell phones), solid-state media storage devices, etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A voltage translator circuit, comprising:

an input stage adapted for receiving an input signal referenced to a first voltage supply;

a latch adapted for connection to a second voltage supply and operative to at least temporarily store a logic state of the input signal;

a voltage clamp coupled between the input stage and the latch, the voltage clamp being operative to set a maximum voltage across the latch to a first prescribed level and to set a maximum voltage across the input stage to a second prescribed level, the voltage translator circuit generating a first output signal at a junction between the latch and the voltage clamp, the voltage translator circuit generating a second output signal at a junction between the voltage clamp and the input stage; and at least first and second output buffers, the first output buffer being operative to receive the first output signal and to generate a first buffered output signal indicative thereof, the second output buffer being operative to receive the second output signal and to generate a second buffered output signal indicative thereof, the first buffered output signal being referenced to the second voltage supply of the voltage translator circuit and to a first bias voltage, the second buffered output signal being referenced to a voltage return of the voltage translator circuit and to a second bias voltage; and wherein the first buffered output signal swings between the second voltage supply of the voltage translator circuit and the first bias voltage, and the second buffered output signal swings between the voltage return of the voltage translator circuit and the second bias voltage.

2. The voltage translator circuit of claim 1, wherein each of the input stage, the latch and the voltage clamp comprises at least one thick oxide transistor.

3. The voltage translator circuit of claim 1, wherein the input stage comprises a pair of transistors connected in a differential input stage configuration.

4. The voltage translator circuit of claim 1, wherein the input stage comprises first and second NMOS transistors, a first source/drain of the first NMOS transistor being adapted for connection to a voltage return of the voltage translator circuit, a second source/drain of the first NMOS transistor being connected to a first node of the voltage clamp, a gate of the first NMOS transistor being adapted for receiving a first signal indicative of a logical complement of the input signal, a first source/drain of the second NMOS transistor being adapted for connection to the voltage return of the voltage translator circuit, a second source/drain of the second NMOS transistor being connected to a second node of the voltage clamp, and a gate of the second NMOS transistor being adapted for receiving a second signal indicative of the input signal.

5. The voltage translator circuit of claim 1, wherein the latch comprises first and second PMOS transistors, a first source/drain of the first PMOS transistor being adapted for connection to a second voltage supply of the voltage translator circuit, a second source/drain of the first PMOS transistor being connected to the voltage clamp at a third node, a gate of the first PMOS transistor being connected to the voltage clamp at a fourth node, a first source/drain of the second PMOS transistor being adapted for connection to the second voltage supply of the voltage translator circuit, a second source/drain of the second PMOS transistor being connected to the voltage clamp at the fourth node, and a gate of the second PMOS transistor being connected to the voltage clamp at the third node.

6. The voltage translator circuit of claim 1, wherein the voltage clamp comprises first and second PMOS transistors and first and second NMOS transistors, a first source/drain of the first and second PMOS transistors being connected to first and second nodes, respectively, of the latch, gates of the first and second PMOS transistors being connected together and adapted to receive a first bias voltage, a second source/drain of the first PMOS transistor being connected to a first source/drain of the first NMOS transistor, a second source/drain of the second PMOS transistor being connected to a first source/drain of the second NMOS transistor, gates of the first and second NMOS transistors being connected together and adapted to receive a second bias voltage, and a second source/drain of the first and second NMOS transistors being connected to first and second nodes, respectively, of the input stage.

7. The voltage translator circuit of claim 6, wherein the first and second bias voltages are substantially equal to one another.

8. The voltage translator circuit of claim 1, wherein the first prescribed level is controlled as a function of the first bias voltage, and the second prescribed level is controlled as a function of the second bias voltage.

9. The voltage translator circuit of claim 1, further comprising at least third and fourth output buffers, the third output buffer being operative to receive a logical complement of the first output signal and to generate a third buffered output signal indicative thereof, the fourth output buffer being operative to receive a logical complement of the second output signal and to generate a fourth buffered output signal indicative thereof, the third buffered output signal being referenced to the second voltage supply of the voltage translator circuit and to the first bias voltage, the fourth buffered output signal being referenced to the voltage return of the voltage translator circuit and to the second bias voltage.

10. The voltage translator circuit of claim 9, further comprising at least one output latch coupled to the voltage clamp and operative to at least temporarily store a logic state of one or more of the output signals generated by the voltage translator circuit.

11. The voltage translator circuit of claim 10, wherein the at least one output latch comprises first and second inverters coupled together in a cross-coupled configuration in which an input of the first inverter is coupled to an output of the second inverter and is adapted to receive the fourth buffered output signal and an input of the second inverter is coupled to an output of the first inverter and is adapted to receive the second buffered output signal, and wherein the first and second inverters are referenced to the second voltage supply of the voltage translator circuit and to the first bias voltage.

12. The voltage translator circuit of claim 10, wherein the at least one output latch comprises first and second inverters coupled together in a cross-coupled configuration in which an input of the first inverter is coupled to an output of the second inverter and is adapted to receive the third buffered output signal and an input of the second inverter is coupled to an output of the first inverter and is adapted to receive the first buffered output signal, and wherein the first and second inverters are referenced to the second bias voltage and to the voltage return of the voltage translator circuit.

13. The voltage translator circuit of claim 1, wherein the first bias voltage and the second bias voltage are driven to different voltage levels as a function of the second voltage supply and first voltage supply, respectively.

14. A buffer circuit, comprising:
at least one voltage translator circuit, the voltage level translator including:
an input stage adapted for receiving an input signal referenced to a first voltage supply;
a latch adapted for connection to a second voltage supply and operative to at least temporarily store a logic state of the input signal; and
a voltage clamp coupled between the input stage and the latch, the voltage clamp being operative to set a maximum voltage across the latch to a first prescribed level and to set a maximum voltage across the input stage to a second prescribed level, the voltage translator circuit generating a first output signal at a junction between the latch and the voltage clamp, the voltage translator circuit generating a second output signal at a junction between the voltage clamp and the input stage;
a first pre-driver circuit coupled to the at least one voltage translator circuit, the first pre-driver circuit being operative to receive the first output signal and to generate a first control signal as a function thereof, wherein the first pre-driver circuit is referenced to a second voltage supply of the voltage translator circuit and to a first bias voltage;
a second pre-driver circuit coupled to the at least one voltage translator circuit, the second pre-driver circuit being operative to receive the second output signal and to generate a second control signal as a function thereof, wherein the second pre-driver circuit is referenced to a voltage return of the voltage translator circuit and to a second bias voltage;
wherein the first control signal swings between the second voltage supply of the voltage translator circuit and the first bias voltage, and the second control signal swings between the voltage return of the voltage translator circuit and the second bias voltage; and
an output stage coupled to the first and second pre-driver circuits, the output stage including at least a first pull-up device adapted for connection between the second voltage supply of the voltage translator circuit and an input/output pad of the buffer circuit, and at least one pull-down device adapted for connection between a voltage return of the voltage translator circuit and the input/output pad.

15. An integrated circuit including at least one voltage translator circuit, the at least one voltage translator circuit comprising:
an input stage adapted for receiving an input signal referenced to a first voltage supply;
a latch adapted for connection to a second voltage supply and operative to at least temporarily store a logic state of the input signal;
a voltage clamp coupled between the input stage and the latch, the voltage clamp being operative to set a maximum voltage across the latch to a first prescribed level and to set a maximum voltage across the input stage to a second prescribed level, the voltage translator circuit generating a first output signal at a junction between the latch and the voltage clamp, the voltage translator circuit generating a second output signal at a junction between the voltage clamp and the input stage; and
at least first and second output buffers, the first output buffer being operative to receive the first output signal and to generate a first buffered output signal indicative thereof, the second output buffer being operative to receive the second output signal and to generate a second buffered output signal indicative thereof, the first buffered output signal being referenced to a second voltage supply of the voltage translator circuit and to a first bias voltage, the second buffered output signal being referenced to a voltage return of the voltage translator circuit and to a second bias voltage; and
wherein the first buffered output signal swings between the second voltage supply of the voltage translator circuit and the first bias voltage, and the second buffered output signal swings between the voltage return of the voltage translator circuit and the second bias voltage.

16. The integrated circuit of claim 15, wherein the voltage clamp comprises first and second PMOS transistors and first and second NMOS transistors, a first source/drain of the first and second PMOS transistors being connected to first and second nodes, respectively, of the latch, gates of the first and second PMOS transistors being connected together and adapted to receive a first bias voltage, a second source/drain of the first PMOS transistor being connected to a first source/drain of the first NMOS transistor, a second source/drain of the second PMOS transistor being connected to a first source/drain of the second NMOS transistor, gates of the first and second NMOS transistors being connected together and adapted to receive a second bias voltage, and a second source/drain of the first and second NMOS transistors being connected to first and second nodes, respectively, of the input stage.

17. The integrated circuit of claim 16, wherein the first and second bias voltages are substantially equal to one another.

18. The integrated circuit of claim 15, wherein the first prescribed level is controlled as a function of the first bias voltage, and the second prescribed level is controlled as a function of the second bias voltage.

19. The integrated circuit of claim 15, wherein the at least one voltage translator circuit further comprises at least third and fourth output buffers, the third output buffer being operative to receive a logical complement of the first output signal and to generate a third buffered output signal indicative thereof, the fourth output buffer being operative to receive a logical complement of the second output signal and to generate a fourth buffered output signal indicative thereof, the third buffered output signal being referenced to the second voltage supply of the voltage translator circuit and to the first bias voltage, the fourth buffered output signal being referenced to the voltage return of the voltage translator circuit and to the second bias voltage.

20. An electronic system, comprising:
  at least one integrated circuit adapted to perform voltage level translation, the at least one integrated circuit including at least one voltage translator circuit comprising:
  an input stage adapted for receiving an input signal referenced to a first voltage supply;
  a latch adapted for connection to a second voltage supply and operative to at least temporarily store a logic state of the input signal;
  a voltage clamp coupled between the input stage and the latch, the voltage clamp being operative to set a maximum voltage across the latch to a first prescribed level and to set a maximum voltage across the input stage to a second prescribed level, the voltage translator circuit generating a first output signal at a junction between the latch and the voltage clamp, the voltage translator circuit generating a second output signal at a junction between the voltage clamp and the input stage; and
  at least first and second output buffers, the first output buffer being operative to receive the first output signal and to generate a first buffered output signal indicative thereof, the second output buffer being operative to receive the second output signal and to generate a second buffered output signal indicative thereof, the first buffered output signal being referenced to a second voltage supply of the voltage translator circuit and to a first bias voltage, the second buffered output signal being referenced to a voltage return of the voltage translator circuit and to a second bias voltage; and
  wherein the first buffered output signal swings between the second voltage supply of the voltage translator circuit and the first bias voltage, and the second buffered output signal swings between the voltage return of the voltage translator circuit and the second bias voltage.

* * * * *